(12) United States Patent
Ichimori et al.

(10) Patent No.: US 8,183,643 B2
(45) Date of Patent: May 22, 2012

(54) SEMICONDUCTOR DEVICE HAVING SILICIDE LAYER COMPLETELY OCCUPIED AMORPHOUS LAYER FORMED IN THE SUBSTRATE AND AN INTERFACE JUNCTION OF (111) SILICON PLANE

(75) Inventors: Takashi Ichimori, Tokyo (JP); Norio Hirashita, Tokyo (JP)

(73) Assignee: Oki Semiconductor Co., Ltd., Tokyo (JP)

( * ) Notice: Subject to any disclaimer, the term of this patent is extended or adjusted under 35 U.S.C. 154(b) by 2032 days.

(21) Appl. No.: 09/962,119

(22) Filed: Sep. 26, 2001

(65) Prior Publication Data

US 2002/0036320 A1 Mar. 28, 2002

(30) Foreign Application Priority Data

Sep. 28, 2000 (JP) ................................. 2000-296327

(51) Int. Cl.
*H01L 29/268* (2006.01)
(52) U.S. Cl. .. 257/384; 257/382; 257/754; 257/E29.268
(58) Field of Classification Search .................. 438/650, 438/651, 655, 656; 257/382, 383, 384, 754, 257/E29.268
See application file for complete search history.

(56) References Cited

U.S. PATENT DOCUMENTS

| 5,168,332 | A |   | 12/1992 | Kunishima et al. |
|-----------|---|---|---------|------------------|
| 5,736,461 | A | * | 4/1998  | Berti et al. ..................... 438/651 |
| 5,756,391 | A |   | 5/1998  | Tsuchiaki |
| 6,008,111 | A |   | 12/1999 | Fushida et al. |
| 6,255,214 | B1 | * | 7/2001 | Wieczorek et al. ........... 438/664 |
| 6,686,274 | B1 |   | 2/2004 | Shimazu et al. |

FOREIGN PATENT DOCUMENTS

| JP | 64-76755 A | 3/1989 |
| JP | 3-12967 A | 1/1991 |
| JP | 3-166736 A | 7/1991 |
| JP | 6-112158 A | 4/1994 |
| JP | 8-288280 A | 11/1996 |
| JP | 8-301612 | 11/1996 |
| JP | 9-251967 A | 9/1997 |
| JP | 10-163130 | 6/1998 |
| JP | 11-111642 | * 4/1999 |
| WO | WO 00/17939 | 3/2000 |

OTHER PUBLICATIONS

W.K. Lai et al., A Novel Process to Form Cobalt Silicide p+ Poly-Si Gates by BF2+ Implantation into Bilayered CoSi/a-Si Films and Subsequent Anneal. 1998 IEEE, pp. 259-261.*
J.H. Ku et al., New Effect of Ti-Capping Layer in Co Silicide Process Promissing for Deep Sub-quarter Micron Technology. 1999 IEEE, pp. 256-25.*
K. Itonaga et al., A Novel Bi-layer Cobalt Silicide Process with Nitrogen Implantation for sub-50nm CMOS and Beyond. 2002 IEEE, pp. 136-137.*

(Continued)

*Primary Examiner* — Anh Mai
(74) *Attorney, Agent, or Firm* — Rabin & Berdo, P.C.

(57) ABSTRACT

A semiconductor device includes diffusion layers formed in a SOI layer under a side-wall, a channel formed between the diffusion layers, silicide layers sandwiching the diffusion layers wherein interface junctions between the diffusion layers and the silicide layers are (111) silicon planes.

3 Claims, 6 Drawing Sheets

OTHER PUBLICATIONS

T. Ichimori et al., Co salicide Technology for Sub-0.15mm FD-SOI and Beyond: Super-flat Silicide Fully-Silicided Source/Drain Structure. IEEE 2000, pp. 72-73.*

A publication titled "Materials Interfacts Atomic-level structure and properties" Editor: D. Wolf and S. Yip Publication Date: 1992 pp. 550 through 552.

A thesis titled "Advanced Silicide for Sub-0.18 μm CMOS on Ultra-thin (35nm)SOI" and published in 1999 IEEE International SOI Conference which was held in Oct. 1999. Author: Baohong Cheng and Jason C.S. Woo pp. 88 and 89.

A thesis titled "Co Salicide Technology for Sub-0.15 μm FD-SOI and beyond: Super-flat Silicide and Fully Silicided Source/Drain Structure" and published in 2000 IEEE International SOI Conference which was held during Oct. 2-5, 2000 Author: Takashi Ichimori and Norio Hirashita pp. 72 and 73.

* cited by examiner

SEMICONDUCTOR DEVICE HAVING SILICIDE LAYER COMPLETELY OCCUPIED AMORPHOUS LAYER FORMED IN THE SUBSTRATE AND AN INTERFACE JUNCTION OF (111) SILICON PLANE

BACKGROUND OF THE INVENTION

1. Field of the invention

The invention relates to a semiconductor device formed on a bulk substrate or SOI (silicon on insulator) substrate and a method of manufacturing the same and, more specifically, to a semiconductor device having an interface of a silicon material and a metal silicide wherein the silicon material and the metal silicide have a high grid alignment at their interface.

2. Description of the related art

In the related art, a metal silicide is formed by forming a metal layer on a silicon layer by a well-known sputtering method, and by a subsequent thermal treatment. The metal silicide is widely used to minimize parasitic resistances of a transistor in a semiconductor device because the resistivity of the metal silicide is much smaller than that of silicon. To form the metal silicide in a semiconductor wafer process, a metal layer is formed on the entire surface of a silicon substrate after transistors including sources, drains and patterned gates, are formed. Then, the semiconductor wafer is subjected to heat. By this thermal treatment, the metal silicide is formed by reacting silicon with metal, wherein heat is applied only at an area where silicon contacts the metal. This method of forming the metal silicide is called "self-aligned silicide" or "salicide" because a patterning process or an alignment process of the silicide is not required. In the method, since the remaining metal, which is not reacted with silicon, is removed by using an anmoniacal solution bath, isolation between semiconductor elements can be maintained.

Currently, titanium (Ti), nickel (Ni) and cobalt (Co) are used as the metal material in the salicide process. Each of the metal silicides formed from these metals has more than two stable phases, which are determined by the temperature at which the metal silicide is formed. For example, when cobalt is reacted with silicon to form cobalt silicide, CoSi or $CoSi_2$ is formed. CoSi is stable when the reaction is performed at a relatively low temperature. On the other hand, $CoSi_2$ is stable when the reaction is performed at a relatively high temperature.

Using the metal silicide in the lowest resistivity phase is effective in reducing the parasitic resistance of the transistor. However, the thermal treatment at a high temperature is required to form the metal silicide in the lowest resistivity phase. When the thermal treatment at the high temperature is performed, the metal silicide reaction is apt to progress horizontally beneath the field oxide layer. As a result, isolation between the transistors may not be maintained. To avoid this problem, the thermal treatment is divided into more than two operations. In a first treatment process, a first metal silicide in a first stable phase is formed at a low temperature. Then, after unreacted metal is removed using an anmoniacal solution bath, the first metal silicide is transformed to a second metal silicide in a second stable phase by a second thermal treatment at a high temperature. The second metal silicide in the second stable phase has low resistivity characteristic because it is formed at a high temperature.

For example, cobalt silicide is formed by the following process. First, a cobalt layer is formed on the entire surface of the silicon substrate after transistors having sources, drains and patterned gates, are formed. Next, by subjecting the silicon substrate to a first thermal treatment at 550° C. for 30 seconds, a first cobalt silicide in a phase in which cobalt mono-silicide (CoSi) layer is a core, is formed from the cobalt and silicon. The first cobalt silicide also includes some metal-rich $Co_2Si$. Then, after the unreacted cobalt is removed by using an anmoniacal solution bath, the silicon substrate is subjected in a second thermal treatment at 800° C. for 30 seconds to form a second cobalt silicide in a second phase. The second cobalt silicide is composed of a stable cobalt di-silicide ($CoSi_2$) phase having low resistivity. In this silicidation process, the relationship between silicon, cobalt and cobalt silicide is as follows. When the entire cobalt layer is transformed to the cobalt silicide, $CoSi_2$ consumes twice the amount of silicon as compared to CoSi. On the other hand, when a fixed amount of silicon is transformed to the cobalt silicide, CoSi consumes twice the amount of cobalt as compared to CO $Si_2$.

In the salicide process of the related art described above, the quality of the interface junction structure between the silicon layer of the channel region and the metal silicide layer is not good. That is, the crystallographic structure of the silicon is not harmonized with the crystallographic structure of the silicide. The reason of this phenomenon is not clear. However, it is considered that this phenomenon relates to the direction in which the silicidation progresses. In other words, the silicidation progresses in multiple directions in the related art. As a result of this phenomenon, problems of junction leakage or parasitic resistance (explained later) may occur.

SUMMARY OF THE INVENTION

It is therefore an objective of the invention to resolve the above-described problem and to provide a semiconductor device having low parasitic resistance and small junction leakage.

The objective is achieved by a semiconductor device having a silicon substrate having a top surface and a bottom surface, an insulator formed on the entire top surface, a silicon layer formed on the insulator, which acts as a channel region, silicon diffusion layers sandwiching the channel region, and silicide layers formed on the insulator by reacting silicon and metal, sandwiching the silicon diffusion layers, each silicide layer forming an interface junction with one of the diffusion layers, wherein each interface junction includes a (111) silicon plane.

The above and further objects and novel features of the invention will more fully appear from the following detailed description, appended claims and accompanying drawings.

DETAILED DESCRIPTION OF THE PREFERRED EMBODIMENTS

First of all, (1) junction leakage and (2) parasitic resistance in a transistor of a semiconductor device are explained as follows.

(1) Junction leakage

As described in the description of the related art, it is known that highly doped silicon diffusion layers (hereinafter simply called diffusion layers), which are a source and drain of a transistor, are transformed to a metal silicide layer in part by reacting the diffusion layer and a metal layer formed on the diffusion layer in order to minimize the parasitic resistance of the transistor. Since parts of the diffusion layers are transformed to the metal silicide layer, an interface junction between each diffusion layer and metal silicide layer inevitably is formed. When the metal silicide layer expands excessively into the diffusion layer in the vertical direction or horizontal direction, the metal silicide layer becomes an undesirable passage for current leakage at the channel region under the gate electrode. In fact, even if the metal silicide layers do not contact to the silicon substrate at the channel region, the leak pass is formed at the channel region when the metal silicide layers are formed closely enough. Therefore, it is necessary to form the metal silicide layers to be smaller than the diffusion layers. However, the depth of the diffusion layer must be getting shallower to suppress a short channel effect caused by the requirements of the shrinkage of transistors. Therefore, the depth of the metal silicide layer is also greatly restricted. However, when a thin metal silicide layer is formed, sheet resistance is increased. This contradicts the object for forming the metal silicide layer for minimizing the parasitic resistance.

To resolve this problem, the following approaches are proposed to reduce the sheet resistance. That is, (a) the interface junction between the metal silicide layer and the diffusion layer is formed to be flat, (b) the metal silicide layer is formed to be spaced from an interface junction between the diffusion layer and the silicon layer at the channel region, and (3) the metal silicide layer is formed to be thick as possible.

(2) Parasitic resistance

Figure 6:
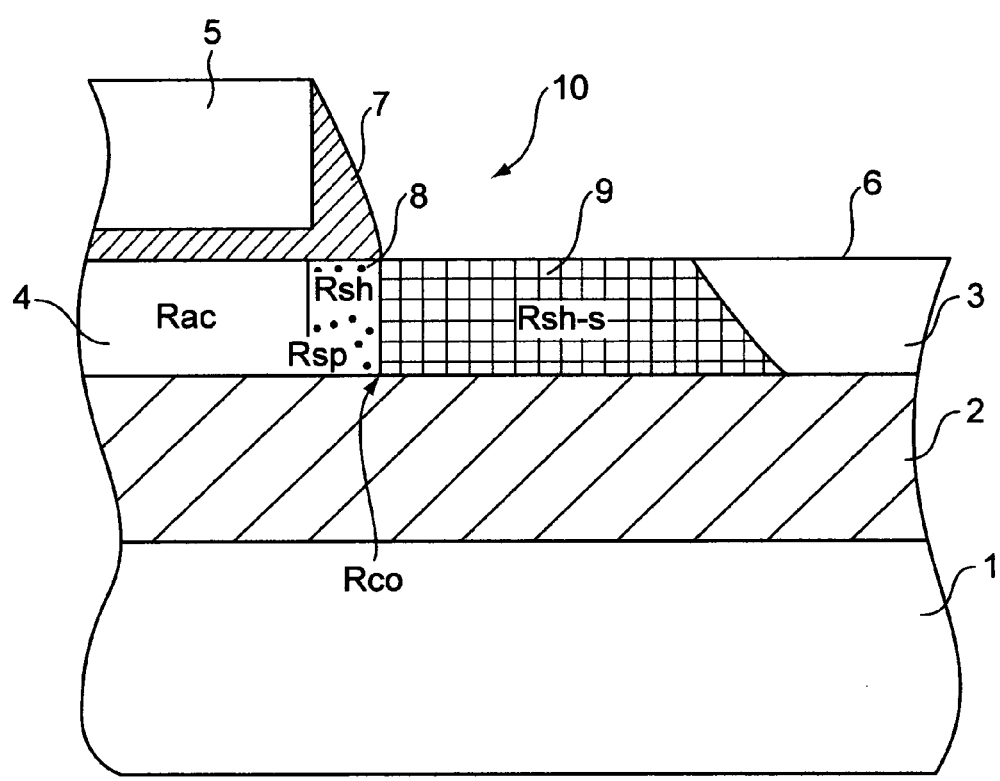
FIG. 6 is an enlarged sectional view used to explain parasitic resistance at an interface junction between a silicon layer and a metal silicide layer.

Referring to FIG. 6, an SOI-FET (Silicon On Insulator-Field Effect Transistor) 10 is disclosed. The SOI-FET is formed on an insulator 2, which is formed on a silicon substrate 1. The SOI-FET, which is defined by a field oxide layer 6, includes a source/drain, a gate electrode 5, a silicon layer 4 acting as a channel region and a side wall 7. The source/drain includes a diffusion layer 8 and a metal silicide layer 9, which are formed in the silicon layer 3 formed on the insulator 2.

As described below, the parasitic resistance of the transistor 10 is influenced by the diffusion layer 8 and the interface between the diffusion layer and the metal silicide layer. In the case of a single drain transistor such as the transistor 10 shown in FIG. 6, the total serial parasitic resistance Rtot is calculated by the following formula:

$$Rtot=2\times(Rac+Rsp+Rsh+Rsh\text{-}s+Rco)$$

where Rac is a storage resistance at an edge of the silicon layer 4, Rsp is an expansion resistance around the bottom of the diffusion layer 8, Rsh is a resistance of the diffusion layer 8, Rsh-s is a resistance of the metal silicide layer, and Rco is a contact resistance at the interface between the diffusion layer 4 and metal silicide layer.

Since the storage resistance Rac, the expansion resistance Rsp and the metal suicide resistance Rsh-s are negligibly small and are difficult to measure accurately, it is possible to neglect them. Therefore, the diffusion resistance Rsh and the contact resistance Rco influence the parasitic resistance of the transistor. When the metal silicide layer 9 is formed uncontrollably, it is expected that defects in the interface between the diffusion layer 8 and the metal silicide layer 9 may occur. Therefore, it is also expected that Schottky barrier heights of the interface between the diffusion layer 8 and the metal silicide layer 9 may be uneven at particular areas thereof. This may cause the contact resistance changed or increased. The problem as to the increase or the change of the contact resistance becomes significant when seeking to minimize the size of transistors. It is therefore an objective of the invention to resolve the above-described problem.

First Preferred Embodiment

Figure 1:
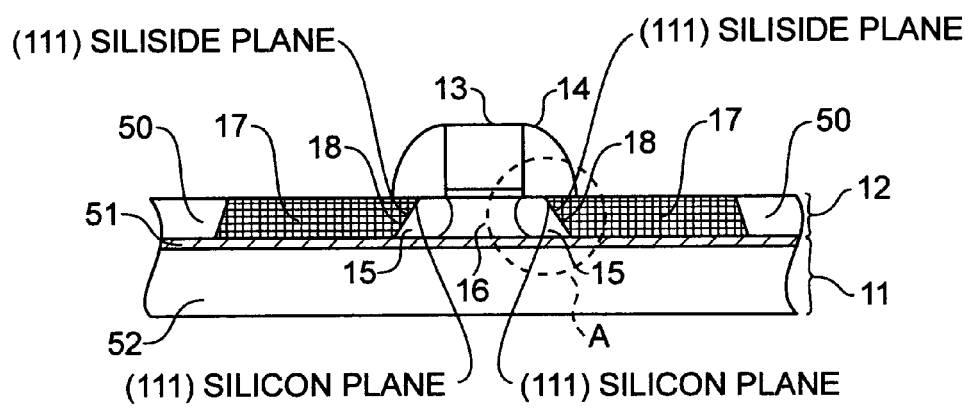
FIG. 1 is a sectional view of a SOI semiconductor device according to a first embodiment of the invention.

Referring to FIG. 1, an SOI-FET 100 formed on a SOI substrate 11 is shown. The SOI substrate 11 is formed of a silicon substrate 52 and an insulator 51, which is formed on the silicon substrate 52. The SOI-FET is defined and isolated from other transistors by a field oxide layer 50. The SOI-FET 100 includes a source/drain, a gate electrode 13, a silicon layer 16 acting as a channel region and a side wall 14. The source/drain includes a diffusion layer 15 and a metal silicide layer 17. The diffusion layer 15 is formed by implanting impurities in the silicon layer. The diffusion layer 15 includes a (111) silicon plane at the interface of the metal silicide layer 17.

The metal suicide layer 17 includes a (111) metal suicide plane at its interface with the diffusion layer 15, when the diffusion layer 15 includes the (111) silicon plane, because the (111) silicon plane has a high grid alignment with the metal silicide layer 17 whose crystallographic structure is a cubic system. Therefore, at the interface junction 18, the diffusion layer 15 includes a (111) silicon plane, and the metal silicide layer 17 includes a (111) metal silicide plane.

Figure 2A:
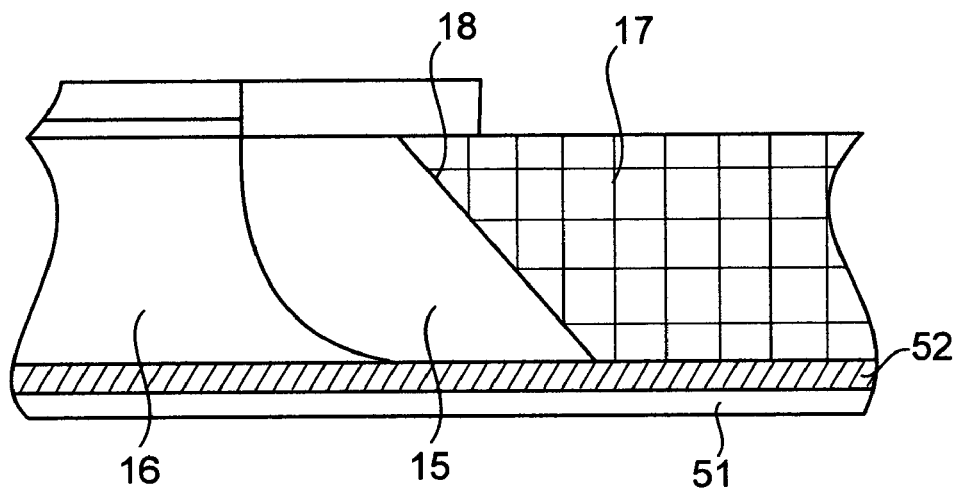
FIG. 2A is an enlarged sectional view of an area A in FIG. 1 showing an interface junction of a first type between a silicon layer and a metal silicide layer.
Figure 2B:
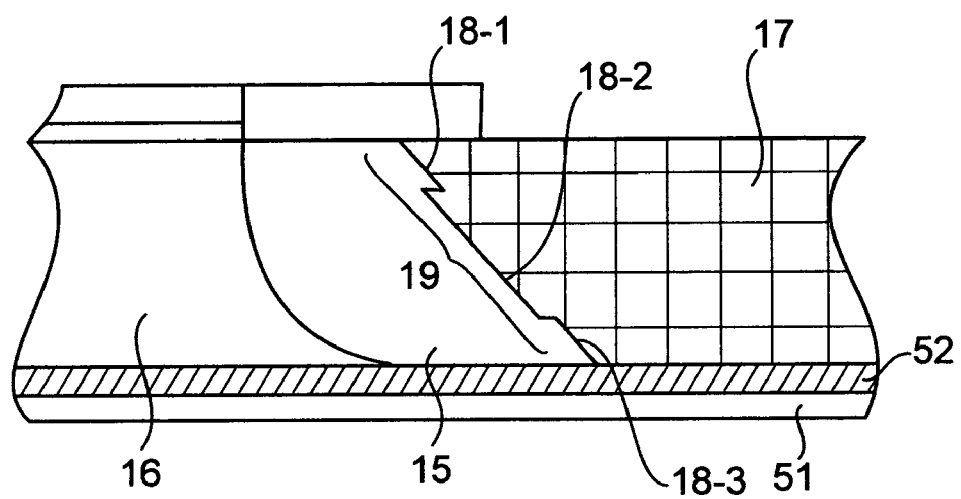
FIG. 2B is an enlarged sectional view of the area A in FIG. 1 showing an interface junction of a second type between a silicon layer and a metal silicide layer.

When the diffusion layer 15 including the (111) silicon plane, and the metal silicide layer 17 including the (111) metal silicide plane are formed, the structures of the interface therebetween shown in FIGS. 2A and 2B may be formed. Referring to FIG. 2A, a first type interface 18 is shown. In this case, a single flat (111) silicon plane is formed. Referring to FIG. 2B, a second type interface 19 is shown. In this case, the second type interface includes several (111) silicon planes 18-1, 18-2, 18-3, which are formed in parallel.

Figure 3A:
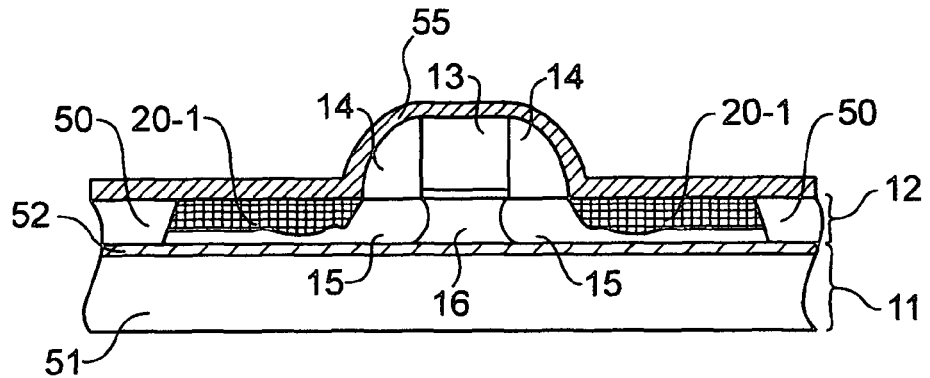
FIGS. 3A through 3C are sequential sectional views for forming the semiconductor device shown in FIG. 1.
Figure 3B:
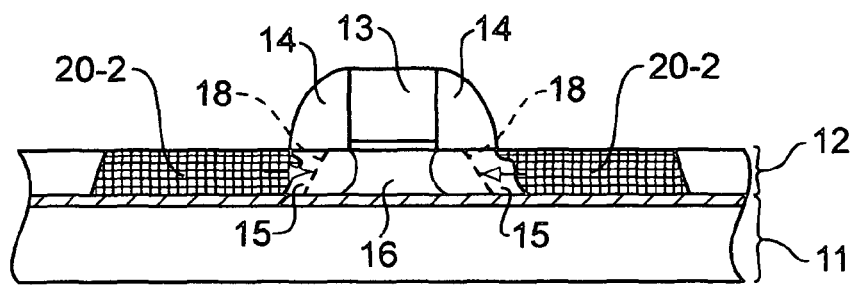
Figure 3C:
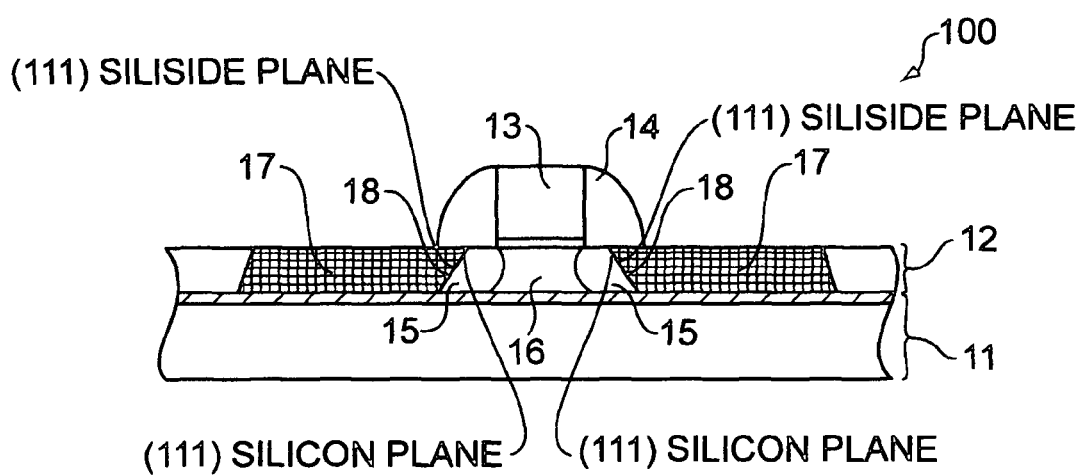

A process of manufacturing the semiconductor device 100 having the first type interface structure is explained with reference to FIGS. 3A through 3C. In this process, as the typical example, cobalt is used for forming the metal silicide layer 17. Referring to FIG. 3A, the SOI layer 12 having a thickness of 32 nm is formed on the SOI substrate 11 that includes the insulator 52 that is formed on the silicon substrate 51. The SOI layer 12 has the (111) silicon plane as its crystal orientation. After forming the field oxide layer 50 for defining an active area, the gate electrode 13 and the side wall 14 are formed on the SOI layer 12, and then, diffusion layer 15 is formed in the SOI layer 12. Next, a cobalt layer 55 having a thickness of 7 nm is formed on the entire surface of the SOI layer 12. Then, the SOI substrate 11 is heated at 550° C. for about 30 seconds as a first thermal treatment. As a result of the first thermal treatment, a cobalt mono-silicide (CoSi) layer 20-1 in a first phase, is formed in the diffusion layer 15 by reacting the cobalt layer 55 and diffusion layer 15. The cobalt mono-silicide layer 20-1, which is formed stable at the low temperature, includes some metal-rich $Co_2Si$.

In general, the amount of the metal silicide layer formed by the condition described above, is determined by proportion of the thickness of the SOI layer 12 to the thickness of the cobalt layer 55. As shown in FIG. 3A, unreacted silicon remains in the diffusion layer 15 under the condition described above.

Next, after an unreacted cobalt layer 55 is removed by using an anmoniacal solution bath, the SOI substrate 11 is heated at 800° C. for about 30 seconds as a second thermal treatment. As a result of the second thermal treatment, the cobalt mono-silicide (CoSi) layer 20-1 in the first phase is transformed to a cobalt di-silicide ($CoSi_2$) 20-2 in a second phase, which is stable at high temperatures. Further, referring to FIG. 3B, since the amount of silicon that is indispensable to transform the CoSi to $CoSi_2$ is insufficient in the CoSi layer 20-1, surplus cobalt is transferred into the diffusion layer in the horizontal direction and the vertical direction. However, as shown in FIG. 3B, the expansion of the $CoSi_2$ layer 20-2 in the vertical direction is stopped when the $CoSi_2$ layer 20-2 reaches the isolator 52. Therefore, the insulator 52 acts as a stopper against the progress of silicidation in the vertical direction. Therefore, once the $CoSi_2$ layer 20-2 has reached the isolator 52, surplus cobalt in the $CoSi_2$ layer 20-2 is transferred into the diffusion layer 15 in the horizontal direction only toward the channel region 16 as indicated by the arrows in FIG. 3B. Since cobalt is transferred from the $CoSi_2$ layer 20-2 into the diffusion layer 15, cobalt is supplied into the diffusion layer 15 gradually. Therefore, cobalt reacts with silicon of the diffusion layer 15 in a thermodynamic equilibrium condition. As a result, the cobalt silicide layer 17 shown in FIG. 3C is formed by layer-by-layer growth along the (111) silicon plane, which is the stable plane of silicon because the crystal growth of metal silicide is progressed along a low energy stable plane. Therefore, as shown in FIG. 3C, after the second thermal treatment is completed, the SOI-FET, which includes the interface junction 18 between the diffusion layer 15 and the metal silicide layer 17 having the (111) silicon plane and the (111) metal silicide plane, is formed. Accordingly, high degrees of grid alignment and evenness at its interface junction 18, can be expected. It is not clear the reason why the (111) silicon plane is formed at the interface junction 18 in this process. However, it is believed that the (111) silicon plane is formed because the silicidation progresses in the horizontal direction only toward the channel region 16.

It is well-known that Fermi level is pinned because of the interface level of silicon so that the Schottky barrier height is held when the junction between the metal and silicon is formed. Generally, it is considered that the interface level of silicon is caused by the grid defects or grid misalignment of these materials for forming the interface junction.

According to the first embodiment of the invention, since the grid defects at the interface junction 18 are dramatically reduced, the contact resistance at the interface junction 18 between silicon and metal suicide is effectively reduced. Further, since an area of the (111) silicon plane at the interface junction is 22% larger than that of the (110) silicon plane, the contact resistance is further reduced because the area of contact between silicon and metal suicide is increased. As a result, the parasitic resistance and the junction leakage of the SOI-FET can be reduced.

Second Preferred Embodiment

The difference between the first and second embodiment is the process of manufacturing the SOI-FET 100 shown in FIG. 1. In the first embodiment, although the thermal treatment is performed twice, the thermal treatment is performed three times in the second embodiment. The details of the manufacturing process in the second embodiment are described below with reference to FIGS. 4A through 4D. In the second embodiment, as a typical example, cobalt is used for forming the metal silicide layer 17.

Figure 4A:
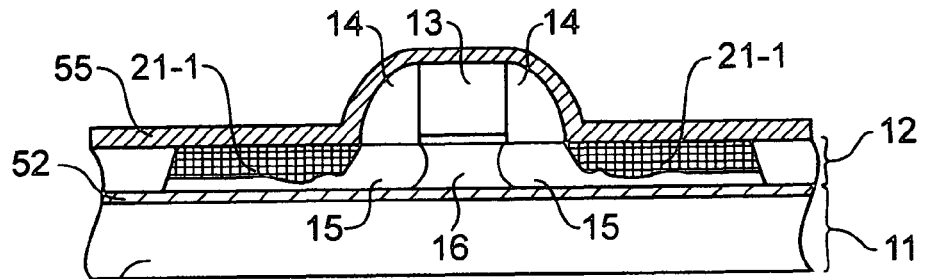
FIGS. 4A through 4D are sequential sectional views for forming the semiconductor device according to a second embodiment of the invention.

Referring to FIG. 4A, the SOI layer 12 having a thickness of 32 nm is formed on the SOI substrate 11 that includes the insulator 52 that is formed on the silicon substrate 51. The SOI layer 12 has the (111) silicon plane as its crystal orientation. After forming the field oxide layer 50 for defining an active area, the gate electrode 13 and the side wall 14 are formed on the SOI layer 12, and then, diffusion layer 15 is formed in the SOI layer 12. Next, a cobalt layer 55 having a thickness of 7 nm is formed on the entire surface of the SOI layer 12. Then the SOI substrate 11 is heated at 550° C. for about 30 seconds as a first thermal treatment. As a result of the first thermal treatment, a cobalt mono-silicide (CoSi) layer 21-1 in a first phase, is formed in the diffusion layer 15 by reacting the cobalt layer 55 and diffusion layer 15. The cobalt mono-silicide layer 21-1, which is formed stable at the low temperature, includes some metal-rich $Co_2Si$.

Figure 4B:
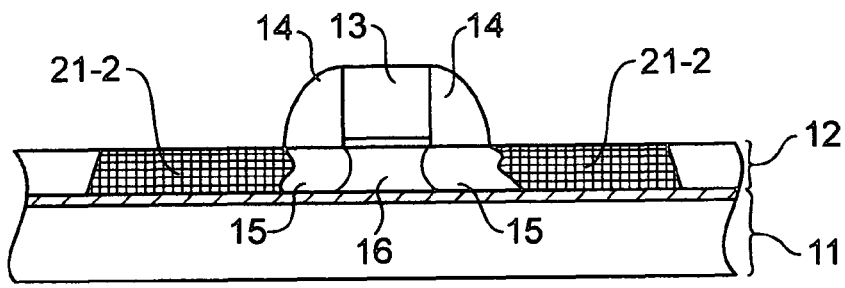

Next, referring to FIG. 4B, after an unreacted cobalt layer 55 is removed by using an anmoniacal solution bath, the CoSi layer 21-1 is phase-transferred to a CoSix (1<x<2) layer 21-2 in a second phase by performing a second thermal treatment. The second thermal treatment is performed at the relatively high temperature around 800° C., which is higher than the temperature of the first thermal treatment. According to the second thermal treatment, the diffusion layer 15 except for an area under the side wall 14 is transformed to the CoSix (1<x <2) layer 21-2. That is, the bottom of the CoSix (1<x<2) layer 21-2 reaches the insulator 52 under the second thermal treatment. However, since the insulator 52 acts as a stopper against the progress of the silicidation in the vertical direction, the metal silicide layer is not formed in the silicon substrate 51 under the insulator 52.

Figure 4C:
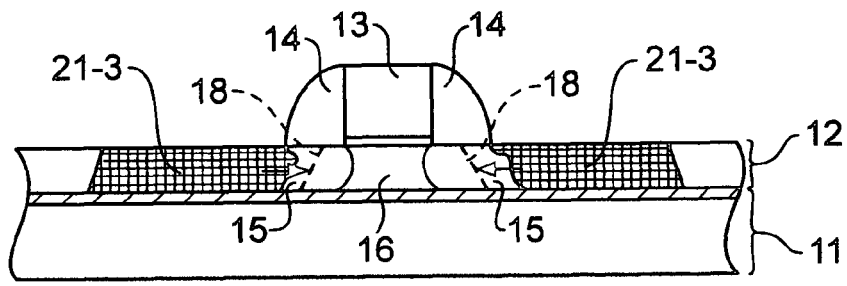

Next, referring to FIG. 4C, a cobalt di-silicide ($CoSi_2$) layer 21-3 having a stoichiometric composition, which is a third phase, is phase-transferred from the CoSix (1<x<2) layer 21-2 by performing a third thermal treatment. The third thermal treatment is performed at the relatively high temperature around 800° C., which is higher than the temperature of the first thermal treatment. When formed at a high temperature, the cobalt silicide layer 21-3 is stable in the phase of $CoSi_2$, and has small resistivity. When the phase of cobalt silicide is transformed from CoSix (1<x<2) to $CoSi_2$, surplus cobalt in the CoSix (1<x<2) layer 20-2 is transferred into the diffusion layer 15 in the horizontal direction only toward the channel region 16 as indicated by as arrows in FIG. 3C. As described above with reference to FIG. 4B, since the bottom of the metal silicide layer 21-2 has reached to the insulator 52, silicon of the diffusion layer, which is unreacted with cobalt, exists under the side wall.

Figure 4D:
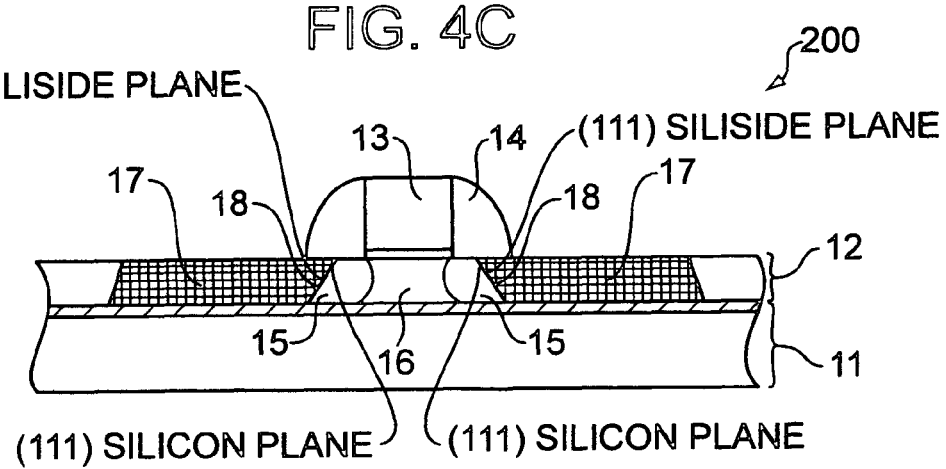

Since cobalt is transferred from the $CoSi_2$ layer 21-3 into the diffusion layer 15, cobalt is supplied into the diffusion layer 15 gradually. Therefore, cobalt reacts with silicon of the diffusion layer 15 in a thermodynamic equilibrium condition. As a result, the cobalt silicide layer 17 shown in FIG. 4D is formed by layer-by-layer growth along the (111) silicon plane, which is the stable plane of silicon because the crystal growth of metal silicide is progressed along a low energy stable plane. Therefore, as shown in FIG. 4D, after the third thermal treatment is completed, the SOI-FET 200, which includes the interface junction 18 between the diffusion layer 15 and the metal silicide layer 17 having the (111) silicon plane, is formed.

The diffusion layer 15 having the (111) silicon plane has high degree of grid alignment with the cobalt silicide 17 at its interface junction. Further, since the crystallographic structure of the cobalt silicide 17 is a cubic system, the cobalt silicide 17 includes the (111) cobalt silicide plane. Therefore, the interface junction structure between the silicon and metal silicide having high degrees of grid alignment and evenness can be obtained because the interface junction is formed with the (111) silicon plane and the (111) metal silicide plane.

In the second embodiment, the second and third thermal treatments are defined as follows. The second thermal treatment is the operation for forming the CoSix layer 21-2, which reaches the insulator 52. The third treatment is the operation for forming the $CoSi_2$ layer 21-3 and for making the (111) silicon plane at the interface 18 between the diffusion layer 15 and the $CoSi_2$ layer 17 by progressing silicidation in the horizontal direction only high degree toward the channel REGION 16.

According to the second embodiment, since the $CoSi_2$ layer 17 is formed by three thermal treatments, higher degree of grid alignment of silicon and metal silicide and higher degree of evenness at the interface are expected in comparison with the transistor 100 formed in the process described in the first embodiment.

Third Preferred Embodiment

In the third embodiment, a metal silicide layer is formed of cobalt as well as the other embodiments. However, a bulk substrate made of silicon is used in the third embodiment, instead of using the SOI substrate.

Figure 5A:
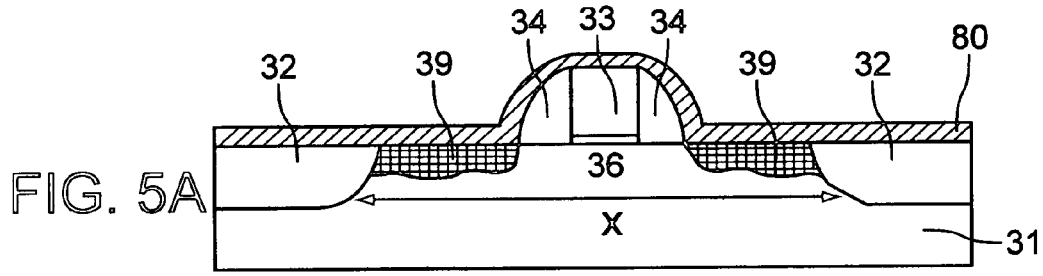
FIGS. 5A through 5E are sequential sectional views for forming the semiconductor device according to a third embodiment of the invention.

Referring to FIG. 5A, a field oxide layer 32 is formed in a silicon substrate 31 to define an active area X. Then, a gate electrode 33 and a side wall 34 are formed on the silicon substrate 31 in the active area X. Then, after a cobalt layer 80 having a thickness of 7 nm, is formed on the entire surface of the silicon substrate 31, a cobalt silicide (CoSi) layer 31 in a first phase is formed by a first thermal treatment in the silicon substrate 31 with reaction between cobalt and silicon. The first thermal treatment is performed at 550° C. for about 30 seconds.

Figure 5B:
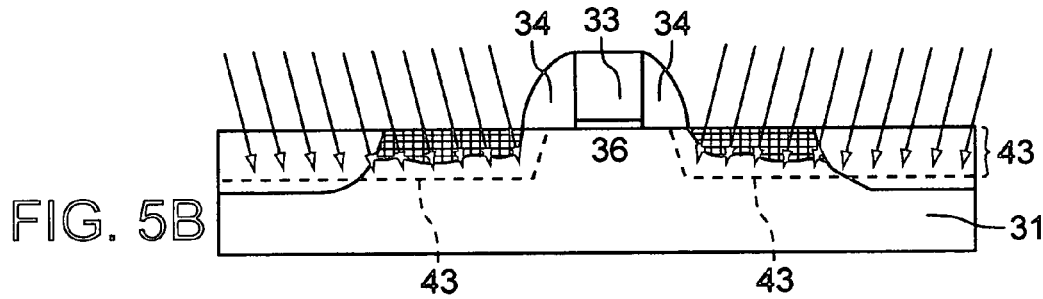

Next, referring to FIG. 5B, after an unreacted cobalt layer 80 is removed by using an anmoniacal solution bath, an amorphous layer 43 is formed in the silicon substrate 31 by ion implantation. In the embodiment, germanium (Ge) is used for the ion implantation. Here, the pre-amorphization energy of the ion implantation depends on the thickness of the amorphous layer 43 to be formed. For example, the amorphous layer 43 having the thickness of 35 nm is formed with 20 KeV, and the amorphous layer 43 having the thickness of 45 nm is formed with 30 KeV.

Figure 5C:
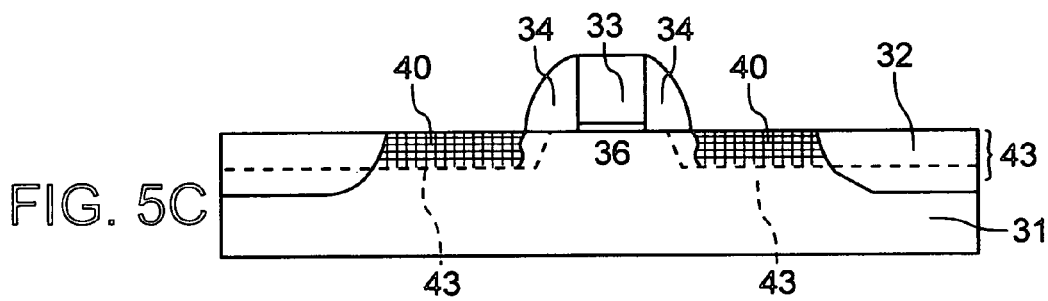

Referring to FIG. 5C, the CoSi layer 39 is phase-transferred to a CoSix (1<x<2) layer 40 in a second phase by a second thermal treatment. The second thermal treatment is performed at the relatively high temperature around 800° C., which is higher than the temperature of the first thermal treatment. According to the second thermal treatment, the CoSix layer reaches the bottom of the amorphous layer 43.

Figure 5D:
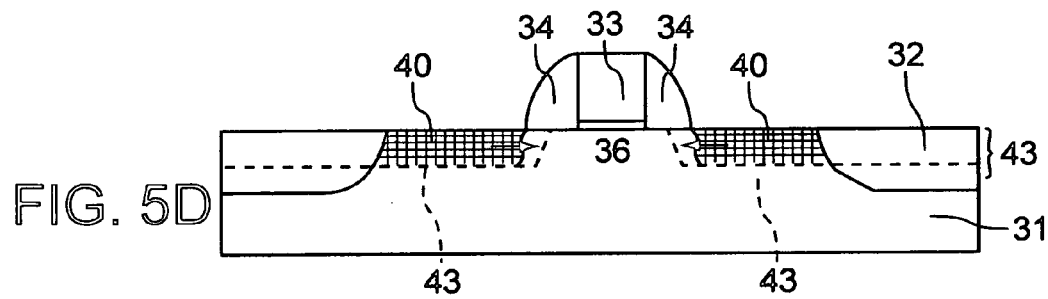

Referring to FIG. 5D, the CoSix layer 40 is phase-transferred to a $CoSi_2$ layer 41 in a third phase by a third thermal treatment. The third thermal treatment is performed at the relatively high temperature around 800° C., which is higher than the temperature of the first thermal treatment. As indicated by the arrows in FIG. 5D, surplus cobalt in the CoSix layer 40 is transferred in the horizontal direction only toward the channel region 36 because amorphous silicon is transformed to metal silicide much easier than crystallized silicon. Therefore, in the third embodiment, the silicon substrate 31 itself acts as a stopper against the progress of the silicidation in the vertical direction.

Figure 5E:
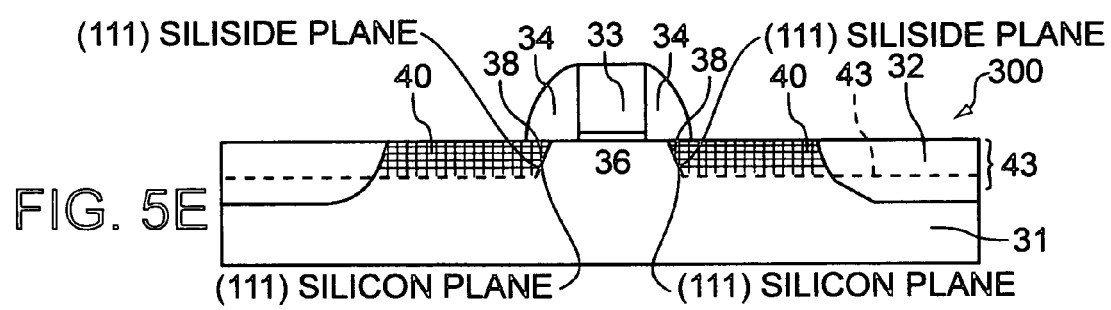

Since cobalt is transferred from the $CoSi_2$ layer 41 into the amorphous layer 43 of the silicon substrate 31 in the horizontal direction only, cobalt is supplied into the amorphous layer 43 of the silicon substrate 31 gradually. Therefore, cobalt reacts on silicon in the amorphous layer 43 in a thermodynamic equilibrium condition. As a result, the cobalt silicide layer 42 shown in FIG. 5E is formed by layer-by-layer growth along the (111) silicon plane, which is the stable plane of silicon because the crystal growth of silicide is progressed along a low energy stable plane. Therefore, as shown in FIG. 5E, after the third thermal treatment is completed, the SOI-FET 300, which includes the interface junction 38 between the silicon substrate 31 in the channel region 36 and the metal silicide layer 42 having the (111) silicon plane, is formed.

The silicon substrate 31 having the (111) silicon plane has a high grid alignment with the cobalt silicide 42 at its interface junction. Further, since the crystallographic structure of the cobalt silicide 42 is a cubic system, the cobalt silicide 42 includes the (111) cobalt silicide plane. Therefore, the interface junction structure between silicon and metal silicide having high degreed of grid alignment and evenness can be obtained because the interface junction is formed with the (111) silicon plane and the (111) metal silicide plane.

In the third embodiment, the second and third thermal treatments are defined as follows. The second thermal treatment is the operation for forming the CoSix layer 40, which reaches the bottom of the amorphous layer 43. The third thermal treatment is the operation for forming the $CoSi_2$ layer 41 and for making the (111) silicon plane at the interface 38 between the silicon substrate 31 in the channel region 36 and the $CoSi_2$ layer 42 by progressing the silicidation in the horizontal direction only toward the channel region 36.

According to the third embodiment, is possible to reduce the parasitic resistance and the junction leakage of the transistor, which is formed in the bulk substrate.

Various other modifications of the illustrated embodiments, as well as other embodiments of the invention, will be apparent to those skilled in the art on reference to this description. For example, in the third embodiment, the second and third thermal treatments can be combined into a single thermal treatment. Therefore, the appended claims are intended to cover any such modifications or embodiments as fall within the true scope of the invention.

We claim:

1. A semiconductor device, comprising:
   a silicon substrate having an active area defined by a field oxide layer formed thereon, wherein the silicon substrate has a first and a second amorphous layers in the active area and a first region between the first and the second amorphous layers in the active area, and wherein the first region acts as a channel;
   a first silicide layer, which completely occupies the first amorphous layer;
   a second silicide layer, which completely occupies the second amorphous layer;
   a gate electrode, which is formed over the first region of the silicon substrate; and
   a side wall, spacer which is formed next to the gate electrode, and which is formed on the first region and on one of the first and the second silicide layers, wherein each interface junction between one of the first and the second silicide layers, which is located directly below the side wall, spacer and the silicon substrate located in the first region, includes a (111) silicon plane.

2. The semiconductor device as claimed in claim 1, wherein the silicide layer includes cobalt.

3. The semiconductor device as claimed in claim 1, wherein the silicide layer is a metal silicide layer and has a crystallographic structure that is a cubic system.

* * * * *